United States Patent [19]

Tanimoto et al.

[11] Patent Number: 4,701,606
[45] Date of Patent: Oct. 20, 1987

[54] PROJECTION OPTICAL APPARATUS

[75] Inventors: Akikazu Tanimoto, Yokohama; Shoji Ishizaka, Kawasaki, both of Japan

[73] Assignee: Nippon Kogaku K.K., Tokyo, Japan

[21] Appl. No.: 792,764

[22] Filed: Oct. 30, 1985

[30] Foreign Application Priority Data

Nov. 1, 1984 [JP] Japan .................. 59-228914

[51] Int. Cl.⁴ .................................... H01J 40/14
[52] U.S. Cl. .................... 250/201; 250/225; 356/124
[58] Field of Search .......... 250/225, 231 R, 201 AF; 356/33, 124, 239, 364–367; 73/705, 800; 350/400

[56] References Cited

U.S. PATENT DOCUMENTS 4,585,342 4/1986 Lin et al. .................. 356/124

FOREIGN PATENT DOCUMENTS 2274906 1/1976 France ...................... 356/33
56-42205 4/1981 Japan.

Primary Examiner—Eugene R. LaRoche
Assistant Examiner—David Mis
Attorney, Agent, or Firm—Michael N. Meller

[57] ABSTRACT

A projection optical apparatus adapted for use in lithographic apparatus for semiconductor device manufacturing purposes and the like. A monitoring light beam of a given polarization is introduced into an imaging optical system of the projection optical apparatus and a polarized component of the monitoring light beam transmitted through the imaging optical system is subjected to photoelectric conversion. A variation of an optical characteristic of the imaging optical system is detected in accordance with the photoelectrically converted output signal.

15 Claims, 7 Drawing Figures

PROJECTION OPTICAL APPARATUS

BACKGROUND OF THE INVENTION

1. Field of the Invention

The present invention relates to a projection optical apparatus including an imaging optical system and more particularly to the detection of variations in the optical characteristics of the imaging optical system.

2. Description of the Prior Art

With projection optical apparatus, e.g., reduction projection-type exposure apparatus or steppers heretofore used as lithographic apparatus for the manufacturing process of very-large-scale integrated circuits of VLSI circuits, the recent demand for the increase of productivity has increased the throughout and the exposure light passed through the projection optical system within a unit time has been increased correspondingly. The energy of the exposure light is partly absorbed and converted to heat by the lenses of the projection optical system, thus causing variations in the refractive index, shape, etc., of the lenses. If such variations of the optical system due to the heat are greater than given values, the imaging characteristics such as the focal position and imaging magnification are affected to degrees that cannot be ignored.

SUMMARY OF THE INVENTION

It is an object of the present invention to provide a projection optical apparatus capable of detecting variations in the optical characteristics of its imaging optical system from time to time.

It is another object of the invention to provide such projection optical apparatus capable of correcting the detected variations of the optical characteristics.

Thus, the apparatus according to the invention comprises means for projecting a monitoring light beam having a given polarization to the imaging optical system, photoelectric detecting means for receiving and converting the monitoring light beam passed through the imaging optical system to an electric signal, and detecting means responsive to the electric signal to detect a variation of the optical characteristic of the imaging optical system.

In accordance with the invention, it is possible to detect from time to time a focussing point variation, magnification variation or the like caused by a thermal change during the use of the optical system and also it is possible to effect in a real-time manner a control corresponding to a variation of the optical characteristic or a control for correcting the variation of the optical characteristic as occasion may demand.

DESCRIPTION OF THE PREFERRED EMBODIMENTS

Figure 1:
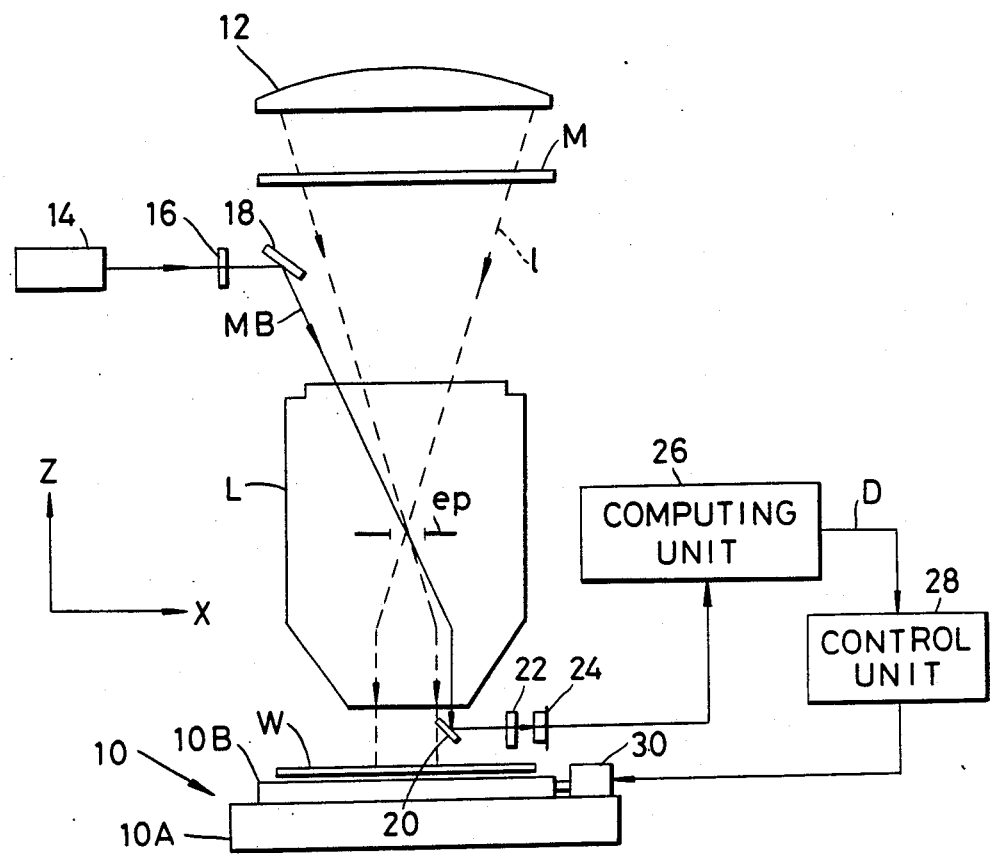
FIG. 1 is a schematic diagram for explaining a first embodiment of a projection optical apparatus according to the invention.

Referring to FIG. 1, there is illustrated a first embodiment of a projection optical apparatus according to the invention. A wafer W to be exposed is mounted on a stage unit 10 which is movable in X, Y and Z directions. The stage unit 10 comprises an XY stage 10A movable in the X and Y directions and a Z stage 10B movable in the Z direction.

A projection lens L is arranged above the wafer W and an exposure illuminating condenser lens 12 is arranged to project light through a mask (or reticle) M above the projection lens L.

The exposure light is projected on the condenser lens 12 from above and is then transmitted through the mask M to fall on the projection lens L. In other words, the exposure light reaches the wafer W through an entrance pupil ep of the projection lens L and the pattern contained in the mask M is projected on the wafer W. The exposure light beam is indicated by broken lines L.

An optical characteristic detecting system will now be described. A light source 14 is arranged above and adjacent to the projection lens L so that the monitoring light beam MB radiated from the light source 14 is projected to the entrance pupil ep of the projection lens L by transmission through a first polarizing plate 16 and reflection off a mirror 18. Also, the monitoring light beam MB transmitted through the projection lens L is projected to a photo-sensor 24 by reflection off a second mirror 20 and transmission through a second polarizing plate 22. Of these component parts, the mirrors 18 and 20 are provided to change the light path and transmit the monitoring light beam MB through the projection lens L and due consideration is given to their arrangement so as to not block the exposure light beam L. The polarizing plate 16 is provided to subject the monitoring light beam MB from the light source 14 to linear polarization and the polarizing plate 22 is provided for output adjusting purposes. In other words, in a thermally stable condition where the exposure light beam 1 is not incident to the projection lens L, the polarizing plate 22 is rotated and the output of the photo-sensor 24 is minimized.

The photo-sensor 24 is connected to a computing unit 26 for performing the computational operations which will be described later and the computing unit 26 is connected to a drive motor 30 through a control unit 28. The drive motor 30 is provided to move the Z stage 10B in a vertical direction or the Z direction.

Next, the overall operation of the first embodiment will be described. Firstly, as mentioned previously, the polarizing plate 22 is rotated to make an adjustment such that the output of the photo-sensor 24 is minimized. Then, as the exposure light beam L is projected to the projection lens L so that a part of the incident light beam is absorbed and the temperature of the projection lens L is increased, its optical characteristic is varied.

More specifically, when there is no strain in the optical elements of the projection lens L, the initial condition is retained and the linearly polarized or circularly polarized light is transmitted as such through the projection lens L. However, when heat is generated due to any partial absorption of the exposure light beam, a strain is caused in the optical element and this strain causes an optical anisotropy or birefringence in the optical elements. As a result, the light beam MB transmitted through the projection lens L is elliptically polarized. The degree of this ellipticity has a linear relation with the magnitude of the strain in the optical element.

The elliptically polarized monitoring light beam MB is converted to a linearly polarized light by the polarizing plate 22 and its light intensity after the conversion corresponds to the degree of the ellipticity or the degree of the strain in the optical element. The photo-sensor 24 generates a signal corresponding to such light intensity.

Figure 2:
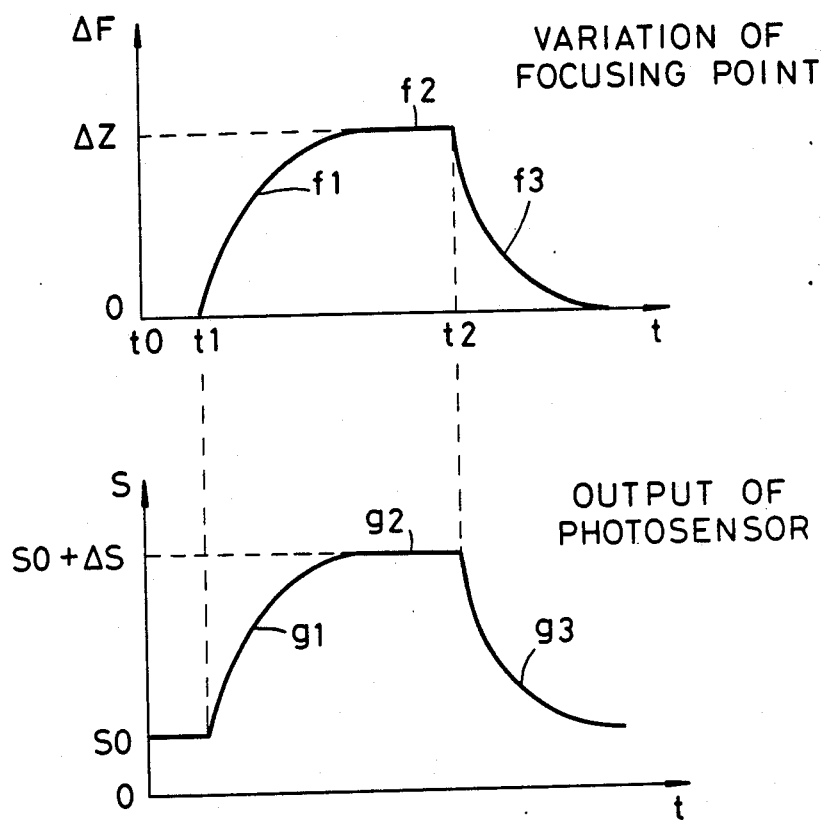
FIG. 2 illustrates graphs showing respectively a variation of the focussing point in the apparatus of FIG. 1 and the corresponding variation of a sensor output signal S.

FIG. 2 shows the variation $\Delta F$ of the focussing point F when the exposure light beam L is incident to the projection lens L and the output S of the photo-sensor 24 corresponding to the variation of the focussing point F. During the time interval from $t_o$ to $t_1$, the exposure light L is not incident to the projection lens L so that there is no variation of the focussing point F and the value of $\Delta F$ is zero. On the other hand, the output S of the photo-sensor 24 has a value $S_o$ corresponding to the residual strain in the projection lens L.

Then, when the exposure light beam L of a given quantity per unit time is projected to the projection lens L at the time $t_1$, the optical characteristic of the projection lens L is varied by the resulting temperature rise and thus the focussing point F of the projection lens L is varied along a curve $f_1$. As a result, the output S of the photo-sensor 24 is varied along a curve $g_1$ substantially in proportion to the curve $f_1$. Then, at the expiration of a predetermined time, the focussing point F is made constant and hence the output S of the photo-sensor 24 is maintained constant. In other words, the focussing point F is increased by $\Delta Z$ and the output S is increased by $\Delta S$.

Then, as the incidence of the exposure light beam L to the projection lens L is stopped at a time $t_2$ so that the temperature of the projection lens L starts to decrease, the focussing point F is varied along a curve $f_3$ and the output S of the photo-sensor 24 is also varied along a curve $g_3$ substantially in proportion to the curve $f_3$.

Since the variation of the focussing point F of the projection lens L is substantially proportional to the variation of the output S of the photo-sensor 24 as mentioned above, the focussing point variation value $\Delta Z$ corresponding to the constant states $f_2$ and $g_2$ is preliminarily obtained on the basis of the test exposures, the focussing point detection by the observing optical system through the projection lens L or the like and the following coefficient K is calculated in accordance with the variation $\Delta Z$ and the corresponding variation $\Delta S$ of the output S of the photo-sensor 24:

$$K = (\Delta Z)/(\Delta S) \quad (1)$$

By so doing, it is possible to obtain the variation value $\Delta Z$ of the focussing point F from the coefficient K and the variation $\Delta S$ of the output S from the photo-sensor 24. This is the same with the magnification variation of the projection lens L. These calculations are performed by the computing unit 26 and the focussing point variation of the magnification variation of the projection lens L is obtained in accordance with the output of the photo-sensor 24. Then, such variation is applied to the control unit 28 so that in accordance with the variation the drive motor 30 is operated and the wafer W is moved vertically in correspondence to the variation of the optical characteristic of the projection lens L or the focussing point variation or in such a manner that the optimum imaging condition is always obtained. Thus, a feature of the first embodiment resides in that any variation of the imaging characteristic of the projection lens L can be monitored even during the exposure operation of the wafer W.

Figure 3:
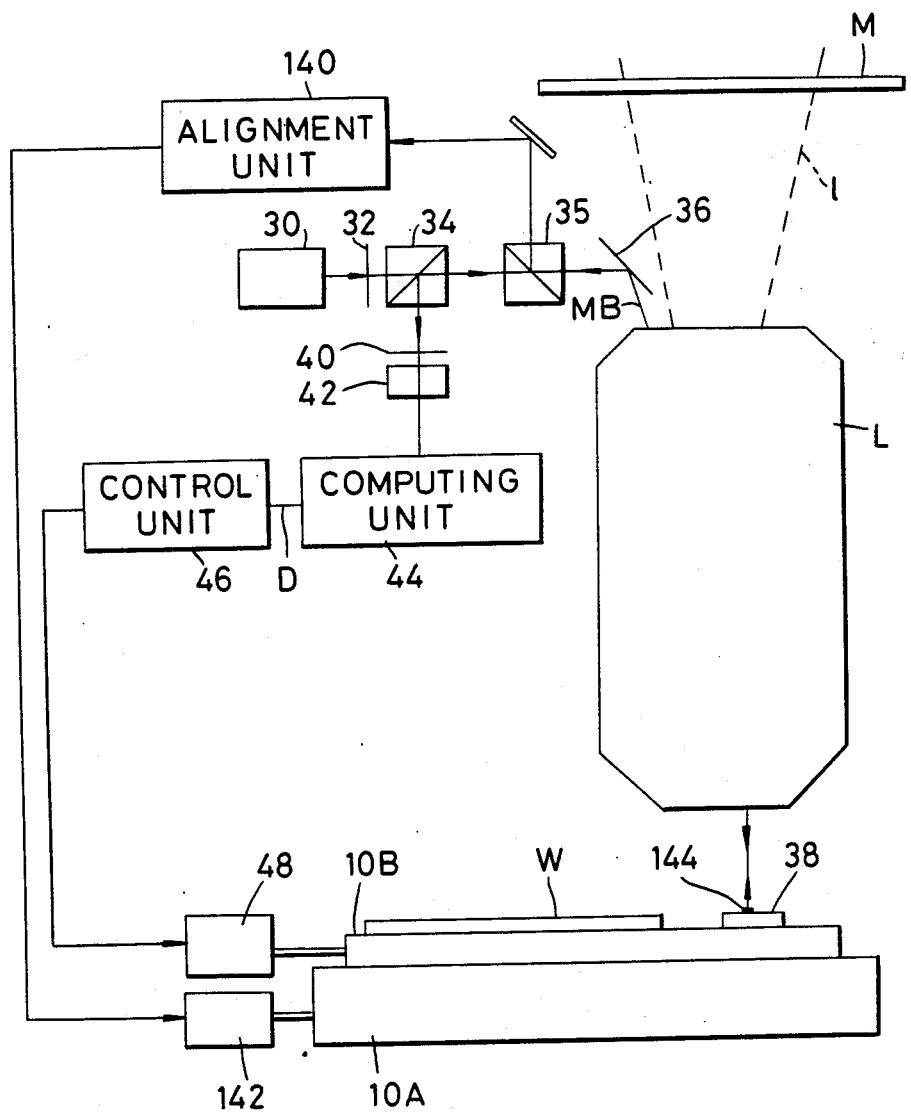
FIG. 3 is a schematic diagram showing a second embodiment of the invention.

A second embodiment of the present invention will now be described with reference to FIG. 3. A light source 30 is arranged above and adjacent to a projection lens L so that the monitoring light beam radiated from the light source 30 is transmitted through a first polarizing plate 32 and beam splitters 34 and 35 and reflected by a mirror 36 to fall on the projection lens L. The monitoring light beam transmitted through the projection lens L is reflected by a mirror 38 arranged on a stage unit 10 so as to again fall on the projection lens L and it is also projected to a second polarizing plate 40 by reflection the mirror 36, transmission the beam splitter 35 and reflection by beam splitter 34. The light transmitted through the polarizing plate 40 is projected onto a photo-sensor 42.

The photo-sensor 42 is connected to a computing unit 44 which is connected to a drive motor 48 through a control unit 46. The drive motor 48 moves a Z stage 10B in a vertical direction.

The basic operation of the second embodiment is the same as that of the previously mentioned first embodiment and the only difference is that the monitoring light beam incident to the projection lens L is again projected to the projection lens L by the mirror 38 and then separated by the beam splitter 34. The second embodiment is so designed that a wafer W on the stage unit 10 is illuminated by the monitoring light beam and therefore the monitoring light beam can also be used as a laser beam for the alignment of the wafer W and a mask M. This is the same as in a third embodiment to be described hereinafter. In other words, the monitoring light beam reflected from the wafer W is reflected by the beam splitter 35 and directed to an alignment unit 140. When the mark on the wafer W is illuminated by the monitoring light beam, the alignment unit 140 detects the scattered or the diffracted light from the mark through the projection lens L so that the spot position of the monitoring light beam or the position of the wafer W relative to the position of the mask M is detected and an XY stage 10A is moved through a drive motor 142.

Also, the second embodiment is characterized by the simplification of the mechanisms below the projection lens L and the provision of a positioning reference mark or fiducial mark 144 on the mirror 38 arranged on the stage unit 10 makes it possible to effect the positioning of the stages by means of the monitoring light beam.

Whereas in the second embodiment the monitoring light beam is projected to the projection lens L from below the mask M, it may be projected from above the mask M. This equally applies to the third embodiment to be described hereinafter.

Figure 4:
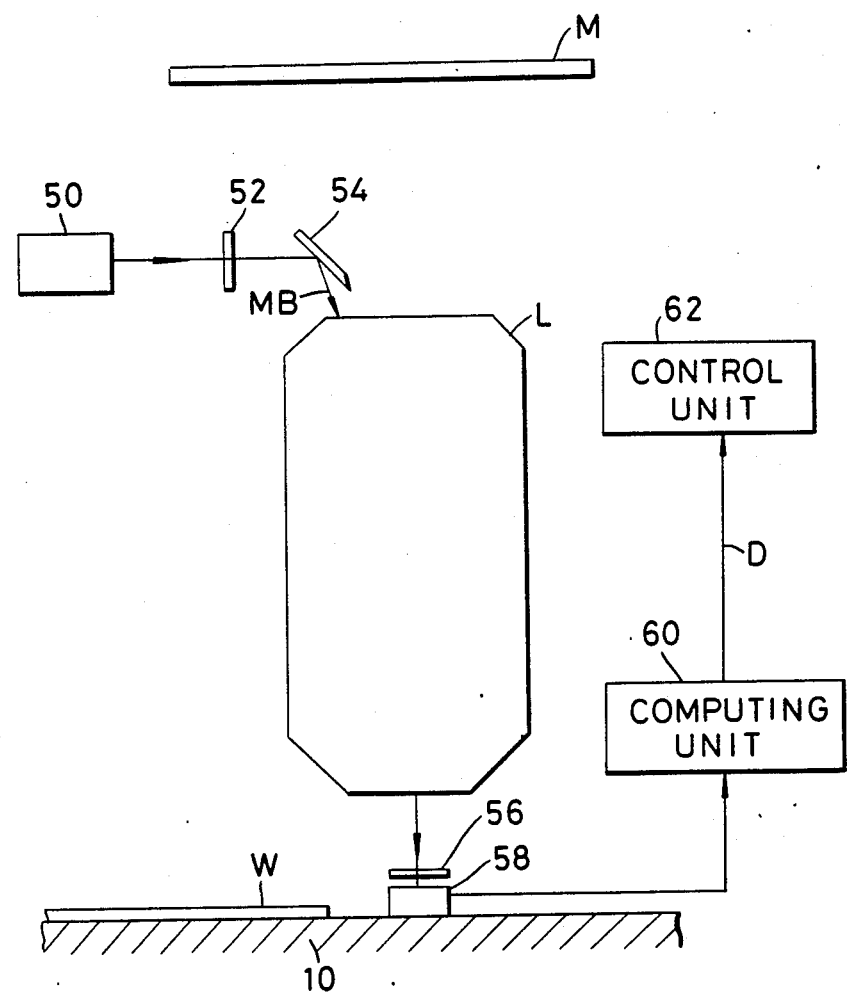
FIG. 4 is a schematic diagram showing a third embodiment of the invention.

The third embodiment of the invention will now be described with reference to FIG. 4. A light source 50 is arranged above and adjacent to a projection lens L and the monitoring light beam radiated from the light source 50 is transmitted through a polarizing plate 52 and reflected by a mirror 54 to fall on the projection lens L. The monitoring light beam transmitted through the projection lens L is transmitted through a polarizing plate 56 arranged on a stage 10 and then it impinges on a photo-sensor 58. The photo-sensor 58 is connected to a computing unit 60 which in turn is connected to a control unit 62.

The operation of the third embodiment is the same as that of the previously mentioned first embodiment except that the polarizing plate 56 and the photo-sensor 58 are arranged on the stage 10. In this embodiment, if the stage 10 is rotated due to its yawing or the like during the movement, the polarizing plate 56 is rotated in the xy plane and the degree of this rotation is on the order of 1 second. Thus, the resulting detection error can be ignored completely.

A fourth embodiment of the invention will now be described with reference to FIG. 5. While this embodiment is similar to the second embodiment shown in FIG. 3 in that the monitoring light beam incident to a projection lens L is reflected so that it again enters the projection lens L, the monitoring light beam reflecting means is fixed in place on the projection lens L.

Figure 5:
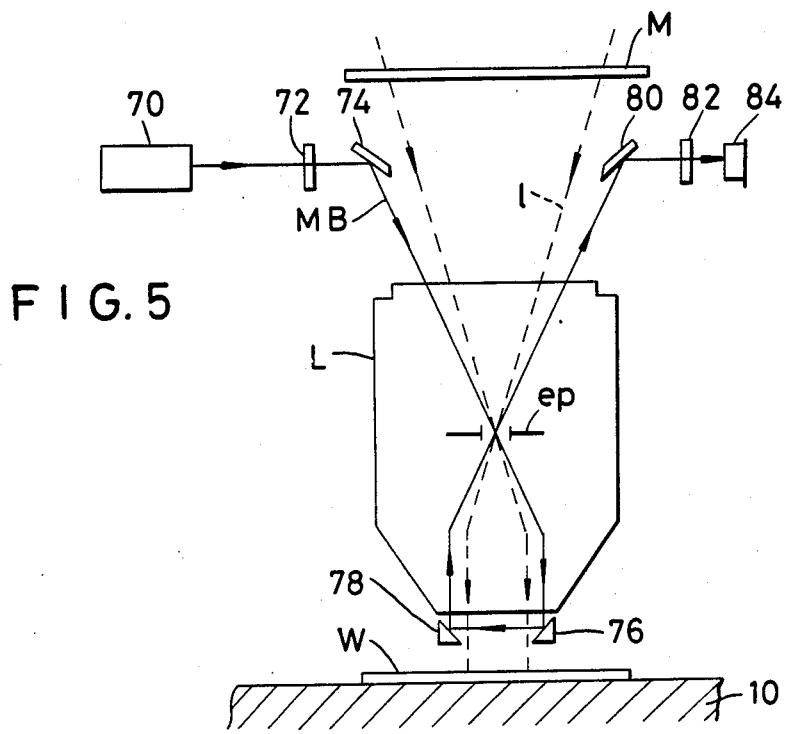
FIG. 5 is a schematic diagram showing a fourth embodiment of the invention.

In FIG. 5, a light source 70 is arranged on the left side of the projection lens L above and adjacent thereto so that the monitoring light beam MB radiated from the light source 70 is projected to a mirror 74 through a polarizing plate 72 and it is then reflected by the mirror 74 to fall on the projection lens L.

The monitoring light beam MB incident to the projection lens L is transmitted through an entrance pupil ep and it advances as shown by the solid-line arrow in the FIG. 5. Since mirrors 76 and 78 are arranged on the exit side of the projection lens L, the monitoring light beam MB transmitted through the projection lens L is reflected vertically or at 90° by each of these mirrors and it is again projected to the projection lens L.

The monitoring light beam projected again to the projection lens L is transmitted through the projection lens L, reflected by a mirror 80 and projected to a photo-sensor 84 through a polarizing plate 82. It is to be noted that the mirrors 74, 76, 78 and 80 should preferably be arranged so as to not block an exposure light beam L. Also, the mirrors 76 and 78 may conveniently be arranged integrally with the projection lens L.

This embodiment is of the relection type as in the previously mentioned second embodiment and therefore the monitoring light beam is transmitted twice through the projection lens L. This has the effect of increasing the detection sensitivity by two times. Also, contrary to the second embodiment, the reflecting means for again projecting the monitoring light beam to the projection lens L is not arranged on the stage 10 so that even during the exposure operation it is possible to effect the operation of detecting any variation of the optical characteristic and hence it is possible to effect the required correction of the optical characteristic or movement of the wafer W in a real-time manner.

Also, since the forward and return paths of the monitoring light beam MB through the projection lens L are different from each other, there is an advantage that the occurrence of a strain in a relatively wide area of the optical element can be detected.

Whereas in the fourth embodiment, the monitoring light beam MB is reflected by the two mirrors 76 and 78, only the mirror 76 may be provided integrally with the projection lens L so that the monitoring light beam MB is reflected and projected to the projection lens L by the mirror 76.

Next, methods of correcting the detected variations of the optical characteristics of the projection lens L will be described.

One method for correcting any variation of the focusing point is to vertically move the wafer W as in the embodiment shown in FIG. 1. In this case, if there is a sensor means for measuring the gap between the projection lens L and the wafer W, the zero point detected as an in-focus point as a result of the application of a suitable offset is caused to follow the variation of the focusing point.

One of the methods for correcting any variation of the magnification is to vary the gap between the projection lens L and the mask M. According to this method, the focal position must also be corrected. Another method is to embed heating and cooling elements in the wafer holder for thermally expanding or contracting the wafer W or to expand or contract the mask M.

Then, there are methods which are applicable to all of these variations and one is to adjust the air pressure in the air gap between the optical lenses forming the projection lens. Another method is to adjust the temperature of the projection lens L as a whole by means of heating and cooling elements.

From a practical point of view, the method of vertically moving the wafer W and the method of adjusting the pressure in the air gap between the optical lenses are more advantageous. In particular, the method by pressure adjustment involves no mechanical movement, is excellent in response and is high in accuracy and reproducibility, thus making it possible to easily effect fine adjustments. These methods will now be described with reference to FIGS. 6 and 7.

Figure 6:
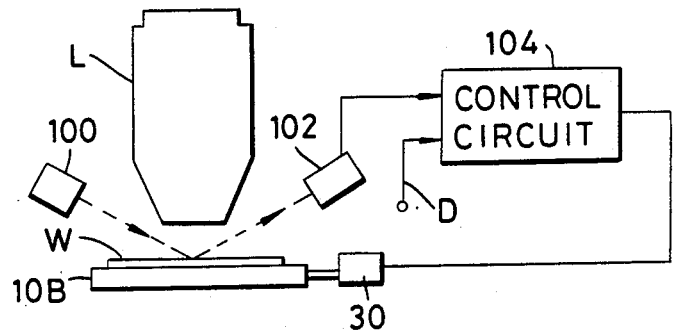
FIG. 6 is a schematic diagram showing an example of a system for vertically moving a wafer.

FIG. 6 shows an example of a system for detecting the vertical position of the wafer W and the system is based on the principle disclosed in Japanese Patent Laid-Open Specification No. 42205/1981. In FIG. 6, the wafer W is mounted on the Z stage 108 which is movable in a vertical direction or the Z direction (see FIG. 1). The projection lens L is arranged above the wafer W and arranged near the sides of the projection lens L are a light projector 100 for projecting a slit image on the wafer W from an oblique direction and a light receiver 102 for receiving a reflected image of the slit image from the wafer W and generating an analog detection signal corresponding to the light receiving position. The light receiver 102 includes a slit for receiving the reflected image of the slit image and a photosensitive element for photoelectrically detecting the transmitted light through the slit, and the reflected image and the slit are subjected to a relative oscillatory scan so that the photoelectric signal is modulated by a given amount and the signal is detected by synchronous detection. The light receiver 102 is connected to a servo control circuit 104.

The servo control circuit 104 receives the signal D from the computing unit 26, 44 or 60 in one of the previously mentioned embodiments and its output is applied to the drive motor 30 of the Z stage 10B.

With the construction described above, it is adjusted so that the analog detection signal generated from the light receiver 102 is reduced to zero when the imaging plane of the projection lens L and the surface of the wafer W coincide in the initial condition where the projection lens L is not illuminated by the exposure light beam L and it is stable. The servo control circuit 104 is responsive to the detection signal from the light receiver 102 to operate the drive motor 30 and the Z stage 10B is moved vertically so as to always reduce the detection signal to zero.

The signal D from the computing unit 24, 44 or 60 has a characteristic as explained in connection with FIG. 2 and the signal D is applied as an offset value to the servo control circuit 104. Thus, under the application of this offset the servo control circuit 104 operates the drive motor 30 and the Z stage 10B is moved vertically, thereby causing the position of the wafer W to follow the variation of the focusing point of the projection lens L.

In this connection, the same effect can be obtained by, for example, varying the inclination of a parallel flat glass so as to shift the imaging position of the slit image from the light projector 100 in the direction of the optical axis of the projection lens L in accordance with the variation information D generated from the computing unit.

Figure 7:
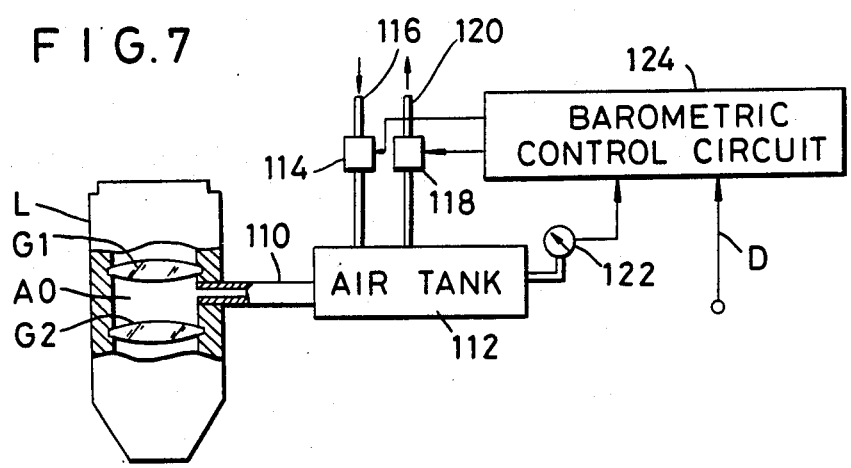
FIG. 7 is a schematic diagram showing an example of a system for correcting the optical characteristic of the optical elements.

FIG. 7 shows the method for adjusting the pressure in the gap between the lenses. Techniques for varying the optical characteristics of an imaging optical system by interlens gap pressure adjustment have already been disclosed in U.S. patent application Ser. No. 632,335 of July 19, 1984. In FIG. 7, a hermetic seal is provided for an air chamber $A_o$ defined by lens elements $G_1$ and $G_2$ arranged in the projection lens L and a gaseous body, e.g., dry air of a given pressure, is externally supplied into the air chamber $A_o$ through a pipe 110. Connected to an air tank 112 connected to the pipe 110 are a pipe 116 including an electromagnetic valve (or needle valve) 114 and a pipe 120 including an electromagnetic valve (or needle valve) 118. Also, a pressure gauge 122 is provided for the air tank 112. The electromagnetic valves 114 and 118 and the pressure gauge 122 are connected to a barometric control circuit 124 and the signal D from the computing unit 26, 44 or 66 is applied to the barometric control circuit 124.

The pipe 126 externally supplies air into the air tank 112 and the pipe 120 exhausts the air in the air tank 112 to the outside. The barometric control circuit 124 is responsive to the signal D to control the opening and closing of the electromagnetic valves 114 and 118. Thus, a variation of the pressure within the air tank 112 causes a variation of the pressure in the air chamber $A_o$ connected to the air tank 112 by the pipe 110. When the pressure in the air chamber $A_o$ varies, the optical characteristics of the projection lens L as a whole, particularly the magnification or the focussing point (the position of the imaging plane), is varied by a small amount. Such optical characteristic variation is linearly related to the pressure in the air chamber $A_o$. When the optical characteristic varies, the signal D from the computing unit 26, 44 or 66 also varies. Thus, the pressure in the air chamber $A_o$ is feedback controlled so as to maintain the signal D at the initial value. This method is capable of maintaining the optical characteristic of the projection lens L at a predetermined value or correcting it in a real-time manner.

Whereas in the above-described embodiments a linearly polarized monitoring light beam is obtained by the combination of a suitable light source and polarizing plates, the polarizing plate on the entrance side of a projection lens may be eliminated by using a light source whose output light is a linearly polarized light, such as a semiconductor laser or He-Ne laser with a Brewster plate. Further, whereas in these embodiments a single monitoring light beam is used for optical characteristic variation detection purposes, the accuracy of optical characteristic variation detection can be improved by using a plurality of monitoring light beams and a plurality of sensor means for detecting the beams and computing the linear combination of sensor outputs or the like.

While the monitoring light beam may be of any wavelength provided that it can be transmitted through the projection lens, a wavelength which does not react with the photoresist on the wafer is preferred since it does not cause any disturbance to the imaging during the exposure. Also, to prevent variation of the optical characteristic due to the absorption of the monitoring light beam, the absorption of the monitoring light beam by the projection lens should preferably be sufficiently small as compared with the absorption of the exposure light beam. In this case, while the detection light quantity of the monitoring light beam is decreased with the resulting deterioration of the S/N ratio, it is possible to improve the S/N ratio by intensity modulating the monitoring light beam by a given amount and demodulating it for detection.

Further, while it is desirable to maintain constant the intensity of the monitoring light beam at the light source, if there is any variation of the intensity, it is possible to prevent the occurrence of any detection error due to the intensity variation by detecting the intensity of the monitoring light beam prior to its incidence to the projection lens by the use of a beam splitter or the like and then comparing the detected intensity with the detection signal from the sensor means.

Still further, whereas in these embodiments the linearly polarized monitoring light beam is used, it is possible to use a circularly polarized monitoring light beam obtained through a quarter-wave plate or the like. In this case, it is necessary that the quarter-wave plate is arranged before the light receiving means and the circularly polarized monitoring light beam is subjected to photoelectric conversion after it has been restored to one nearly equal to a linearly polarized light.

While these embodiments and modifications have been shown and described as applied to steppers, the present invention is in no way limited thereto and the invention is equally applicable to other optical apparatus. Further, it is possible to arrange so that when the optical characteristic of the optical system exceeds the allowance, the operation of the apparatus is stopped or a warning is issued. Also, while the embodiments note thermal variations of the optical characteristic due to the absorption of the exposure light beam, the present invention is equally applicable to the monitoring of variations of the optical characteristics due to rapid changes in the surrounding temperature or the atmospheric pressure or any external shock.

We claim:
1. A projection optical apparatus including an imaging optical system for forming an image of an object on a given plane of projection, said apparatus comprising:
(a) means for radiating a monitoring light beam toward said imaging optical system for transmission therethrough, said monitoring light beam comprising a polarized light;
(b) light receiving means for receiving said monitoring light transmitted through said imaging optical system and generating an electric signal corresponding to the quantity of said received light beam:
(c) detecting means responsive to said electric signal from said light receiving means to detect a varia- tion of an optical characteristic of said imaging optical system; and (d) means for adjusting the position of said plane of projection in accordance with said optical characteristic variation detected by said detecting means.

2. An apparatus according to claim 1, wherein said light receiving means comprises a polarizing plate for extracting a linearly polarized light component from said monitoring light beam, and means for converting said extracted linearly polarized light component to said electric signal.

3. An apparatus according to claim 1, wherein said radiating means comprises a light source and a polarizing plate for linearly polarizing a beam of light from said light source.

4. An apparatus according to claim 1, wherein said detecting means includes means for determining a variation of a focussing point of said imaging optical system, and wherein said adjusting means moves said plane of projection relative to said imaging optical system in accordance with said focussing point variation determined by said determining means.

5. A projection optical apparatus including an imaging optical system for forming an image of an object on a given plane of projection, said imaging optical system including a plurality of lens elements arranged at a distance apart so as to define therebetween an externally sealed separate space, said apparatus comprising:
(a) means for radiating a monitoring light beam toward said imaging optical system for transmission therethrough, said monitoring light beam comprising a polarized light;
(b) light receiving means for receiving said monitoring light transmitted through said imaging optical system and generating an electric signal corresponding to the quantity of said received light beam;
(c) means responsive to said electric signal from said light receiving means to detect a variation of an optical characteristic of said imaging optical system; and
(d) means for controlling a pressure within said separate space in accordance with said optical characteristic variation detected by said detecting means.

6. A projection optical apparatus including an imaging optical system having an entrance opening facing a first plane and an exit opening facing a second plane and adapted to form on said second plane an image of an object placed on said first plane, said apparatus comprising:
(a) means for radiating a beam of polarized light;
(b) first optical means for causing said polarized light beam to enter said imaging optical system through said entrance opening and emerge therefrom through said exit opening;
(c) light receiving means for receiving said polarized light beam transmitted through said imaging optical system and generating an electric signal corresponding thereto;
(d) means for detecting a variation of an optical characteristic of said imaging optical system in accordance with said electric signal from said light receiving means; and
(e) second optical means for causing said polarized light beam emerging from said exit opening to reenter into said imaging optical system through said exit opening and reemerge from said entrance opening, wherein said light receiving means receives said polarized light beam reemerging from said entrance opening.

7. An apparatus according to claim 6, wherein said light receiving means comprises a polarizing plate for extracting a linearly polarized light component from said polarized light beam, means for converting said extracted linearly polarized light component to said electric signal, and a third optical means for directing said polarized light beam emerging from said exit opening toward said converting means through said polarizing plate.

8. An apparatus according to claim 6, wherein said second optical means includes a reflection surface parallel to said second plane, and wherein said light receiving means includes a beam splitter arranged between said radiating means and said entrance opening.

9. A projection optical apparatus including an imaging optical system for forming an image of an object on a given plane of projection, said apparatus comprising:
(a) means for radiating a monitoring light beam toward said imaging optical system for transmission therethrough, said monitoring light beam comprising a polarized light;
(b) light receiving means for receiving said monitoring light transmitted through said imaging optical system and generating an electric signal corresponding to the quantity of said received light beam;
(c) means responsive to said electric signal from said light receiving means for detecting a variation of a magnification of said imaging optical system; and
(d) means for adjusting said image at a constant size relative to the size of said object in response to said detecting means.

10. A projection optical apparatus comprising:
(a) an imaging optical system for forming on a first plane an image of an object arranged in second plane;
(b) mark means provided in the vicinity of said first plane;
(c) means for radiating a beam of polarized light toward said mark means said polarized light beam passing through said imaging optical system;
(d) polarimeter means for receiving a part of said polarized light beam passed through said imaging optical system to detect a variation of an optical characteristic of said imaging optical system; and
(e) alignment means for receiving a part of said polarized light beam reflected by said mark means.

11. An apparatus according to claim 10, further comprising a beam splitter provided to divide said polarized light beam.

12. An apparatus according to claim 11, wherein said imaging optical system has an entrance opening facing said second plane and an exit opening facing said first plane, said mark means includes a reflecting surface to reflect said polarized light beam emerging from said exit opening toward said imaging optical system, and said beam splitter is arranged in an optical path of the beam reflected by said reflecting surface.

13. An apparatus according to claim 12, wherein said polarized light beam reflected by said reflecting surface reenters into said imaging optical system through said exit opening and reemerges from said entrance opening, and said beam splitter is arranged in an optical path of the beam reemerged from said entrance opening.

14. An apparatus according to claim 10, wherein said alignment means is provided to receive a light beam scattered by said mark means.

15. An apparatus according to claim 10, further comprising stage means for supporting said mark means, said alignment means detects the positional relation between said object and said mark means.

* * * * *